United States Patent
Saiki et al.

(10) Patent No.: US 10,006,941 B2
(45) Date of Patent: Jun. 26, 2018

(54) POSITION ACCURACY INSPECTING METHOD, POSITION ACCURACY INSPECTING APPARATUS, AND POSITION INSPECTING UNIT

(71) Applicant: Tokyo Electron Limited, Tokyo (JP)

(72) Inventors: Kenta Saiki, Nirasaki (JP); Toshihiko Tanaka, Nirasaki (JP); Muneaki Tamura, Nirasaki (JP); Kazuhiko Koshimizu, Beaverton, OR (US); Shinji Akaike, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/515,241

(22) PCT Filed: Aug. 19, 2015

(86) PCT No.: PCT/JP2015/073923
§ 371 (c)(1),
(2) Date: Mar. 29, 2017

(87) PCT Pub. No.: WO2016/052012
PCT Pub. Date: Apr. 7, 2016

(65) Prior Publication Data
US 2017/0219625 A1   Aug. 3, 2017

(30) Foreign Application Priority Data

Sep. 30, 2014   (JP) .................................. 2014-200912

(51) Int. Cl.
*G01R 1/067*   (2006.01)
*G01R 31/27*   (2006.01)
*G01R 31/26*   (2014.01)

(52) U.S. Cl.
CPC ..... *G01R 1/06794* (2013.01); *G01R 31/2601* (2013.01); *G01R 31/27* (2013.01)

(58) Field of Classification Search
CPC ............ G01R 31/2886; G01R 31/2887; G01R 31/2889; G01R 31/2891; G01R 31/2893;
(Continued)

(56) References Cited

U.S. PATENT DOCUMENTS

| 5,416,592 A | 5/1995 | Mori |
| 6,549,649 B1 * | 4/2003 | Penkethman ...... G01R 31/2891 250/491.1 |

(Continued)

FOREIGN PATENT DOCUMENTS

| JP | S63305525 | * 12/1988 |
| JP | 07-297242 A | 11/1995 |

(Continued)

OTHER PUBLICATIONS

English machine translation of Takagi JPS63305525 and abstract.*
International Search Report for PCT/JP2015/073923 dated Nov. 2, 2015.

*Primary Examiner* — Tung X Nguyen
*Assistant Examiner* — Lee Rodak
(74) *Attorney, Agent, or Firm* — Pearne & Gordon LLP (57) ABSTRACT

A contact position of a probe needle with respect to electrode pads 71 to 75 of a semiconductor device is inspected in advance when performing an inspection by a prober on the semiconductor device formed on a wafer W placed on a stage 11. A reticle 31 on which shapes 61 to 65 indicating positions of the probe needles are formed is placed instead of the probe needles at a position where the probe needles are arranged. The semiconductor device formed on the wafer W is imaged by the imaging unit 33 through the reticle 31. A positional relationship between the shapes formed on the reticle 31 and the electrode pads 71 to 75 is analyzed from
(Continued)

the image. When necessary, a position of the stage 11 is adjusted such that centers of the shapes 61 to 65 and centers of the electrode pad 71 to 75 are coincident.

13 Claims, 6 Drawing Sheets

(58) Field of Classification Search
CPC ............ G01R 31/2834; G01R 31/2832; G01R 31/2831; G01R 35/00; G01R 35/005; G01R 1/0408; G01R 1/06705; G01R 1/073; G01R 1/07314; G01R 1/07364; G01R 3/00
See application file for complete search history.

(56) References Cited

U.S. PATENT DOCUMENTS

| | | | |
|---|---|---|---|
| 6,710,798 B1 * | 3/2004 | Hershel | G01R 31/2887 324/750.23 |
| 2007/0132468 A1 * | 6/2007 | Nakayama | G01R 31/2891 324/750.22 |
| 2007/0229098 A1 * | 10/2007 | Kobayashi | G01R 31/2891 324/750.23 |
| 2010/0117672 A1 * | 5/2010 | Portune | G01R 31/2891 324/750.24 |
| 2010/0196136 A1 * | 8/2010 | Gunji | G01R 3/00 414/806 |
| 2011/0089965 A1 * | 4/2011 | Endres | G01R 35/00 324/755.01 |

FOREIGN PATENT DOCUMENTS

| | | |
|---|---|---|
| JP | 2001-156127 A | 6/2001 |
| JP | 2001-264392 A | 9/2001 |

* cited by examiner

POSITION ACCURACY INSPECTING METHOD, POSITION ACCURACY INSPECTING APPARATUS, AND POSITION INSPECTING UNIT

CROSS-REFERENCE TO RELATED APPLICATION

This Application is a U.S. national phase application under 35 U.S.C. § 371 of PCT Application No. PCT/JP2015/073923 filed on Aug. 19, 2015, which claims the benefit of Japanese Patent Application No. 2014-200912 filed on Sep. 30, 2014, the entire disclosures of which are incorporated herein by reference.

TECHNICAL FIELD

The various embodiments described herein pertain generally to a position accuracy inspecting method, a position accuracy inspecting apparatus and a position inspecting unit for inspecting a contact position when performing a contact type inspection upon an inspection target chip such as a semiconductor device formed on an inspection target substrate such as a semiconductor wafer.

BACKGROUND ART

There is known a probe apparatus (hereinafter, referred to as "prober") which inspects electrical characteristics of a semiconductor device as an example of an inspection target chip formed on a semiconductor wafer (hereinafter, simply referred to as "wafer") as an example of an inspection target substrate.

As an example of such a prober, there is known a prober equipped with a probe card having a preset number of probe needles (probes) each of which is to be brought into contact with corresponding one of a plurality of semiconductor devices formed on a wafer; and a stage configured to be freely movable in up-and-down and left-right directions while placing thereon the wafer (see, for example, Patent Document 1). In this prober, the probe needles are brought into contact with electrode pads or solder bumps of the semiconductor device, and by flowing an inspection current to the electrode pads or the solder pumps from the probe needles, the electrical characteristics of the semiconductor device is inspected.

In the prober described in Patent Document 1, by moving the stage two-dimensionally, a position of the semiconductor device facing the probe needles is adjusted, and the inspection is performed while sequentially changing semiconductor devices to be inspected. In this way, the electrical characteristics of a part of or all of the semiconductor devices formed on the wafer can be inspected.

In the inspection of the semiconductor device by the prober, the probe needles provided on the probe card need to be brought into secure contact with the electrode pads or the solder bumps of the semiconductor device formed on the wafer. For the purpose, prior to inspecting a product wafer, by using a reference wafer on which the semiconductor device equivalent to that of the product wafer as an inspection target is formed, it is inspected whether the probe needles come into accurate contact with the semiconductor device. In the reference wafer, a position on which the semiconductor device is formed is already known.

To elaborate, the reference wafer is aligned with the stage, and the stage is driven such that the preset semiconductor device formed on the reference wafer is located directly under the probe needles. Then, the probe needles are pressed against the electrode pads of the semiconductor device which is located directly under it, so that needle marks are left on the electrode pads. By taking out the wafer and checking the needle marks with naked eyes, it can be inspected whether the preset semiconductor device is positioned within an allowable region with respect to the probe needles.

Patent Document 1: Japanese Patent Laid-open Publication H07-297242

DISCLOSURE OF THE INVENTION

Problems to be Solved by the Invention

In the method of forming the needle marks directly on the reference wafer, however, the semiconductor device once given the needle marks cannot be used again. Thus, there may be a problem that the reference wafer needs to be prepared regularly. Further, as consumption of the probe needles progresses, the lifetime of the probe card is shortened, which results in a cost increase. Furthermore, though the contact between the probe needles and the electrode pads or the solder bumps can be inspected by checking the needle marks with operator's naked eyes, it is difficult to improve alignment accuracy of the wafer based on such observation result through the naked eyes.

In view of the foregoing, exemplary embodiments provide a position accuracy inspecting method, a position accuracy inspecting apparatus and a position inspecting unit which enable a simple high-accuracy inspection of a contact position when performing a contact type inspection of an inspection target chip formed on an inspection target substrate.

Means for Solving the Problems

In an exemplary embodiment, there is provided a position accuracy inspecting method of inspecting a contact position when performing a contact type inspection by a probe needle on a preset region of at least one inspection target chip formed on an inspection target substrate. Here, the position accuracy inspecting method includes a placement process of placing the inspection target substrate on a substrate placing table; an imaging process of placing, instead of the probe needle, at a position where the probe needle is arranged, a glass substrate on which a shape indicating a position of the probe needle to be brought into contact with the inspection target substrate is formed, and imaging the at least one inspection target chip formed on the inspection target substrate through the glass substrate; and an analysis process of analyzing a positional relationship between the shape and the preset region from at least one image obtained by the imaging process.

It is desirable that the position accuracy inspecting method includes a determination process of determining whether the probe needle is allowed to be brought into contact with the preset region based on the positional relationship between the shape and the preset region obtained by the analysis process.

It is desirable to determine that, in the determination process, the probe needle is allowed to be brought into contact with the preset region when a distance between a center of the shape and a center of the preset region is within a preset threshold value.

It is desirable that the position accuracy inspecting method includes a correction process of correcting, when it is determined in the determination process that a center of the shape and a center of the preset region is not coincident within preset accuracy, coordinates of the substrate placing table such that the center of the shape and the center of the preset region are coincident.

It is desirable that the at least one inspection target chip is plural in number, and at least two or more inspection target chips formed on the inspection target substrate are imaged through the glass substrate without moving the substrate placing table in the imaging process. Further, it is desirable that the at least one image is plural in number, and the analysis process and the determination process are performed on each of the obtained images, and the correction process is performed when it is determined that the center of the shape and the center of the preset region are not coincident within the preset accuracy for at least one image.

It is desirable that the inspection target substrate is a semiconductor wafer, and the at least one inspection target chip is a semiconductor device. Further, it is desirable that the preset region is an electrode pad or a solder bump of the semiconductor device.

In another exemplary embodiment, there is provided a position accuracy inspecting apparatus configured to inspect a contact position when performing a contact type inspection by a probe needle on a preset region of an inspection target chip formed on an inspection target substrate. Here, the position accuracy inspecting apparatus includes a substrate placing table configured to place the inspection target substrate thereon; at least one imaging unit disposed above the substrate placing table; and an analysis device configured to analyze an image obtained by the at least one imaging unit. Further, the at least one imaging unit includes a glass substrate, placed instead of the probe needle at a position where the probe needle is arranged, on which a shape indicating a position of the probe needle to be brought into contact with the inspection target substrate is formed; and an imaging device configured to image the inspection target substrate placed on the substrate placing table through the glass substrate. Furthermore, the analysis device analyzes a positional relationship between the shape and the preset region from an image obtained by imaging the inspection target chip formed on the inspection target substrate through the glass substrate.

It is desirable that the at least one imaging unit is plural in number.

It is desirable that the analysis device determines whether the probe needle is allowed to be brought into contact with the preset region based on the positional relationship between the shape and the preset region.

It is desirable that the position accuracy inspecting apparatus includes a driving mechanism configured to move the substrate placing table in an in-plane direction parallel to a placing surface of the substrate placing table and configured to rotate the substrate placing table with respect to an axis orthogonal to the placing surface. Further, it is desirable that the analysis device controls, when it is determined that a center of the shape and a center of the preset region is not coincident within preset accuracy, the driving mechanism to correct coordinates of the substrate placing table such that the center of the shape and the center of the preset region are coincident.

It is desirable that the inspection target substrate is a semiconductor wafer, and the inspection target chip is a semiconductor device. Further, it is desirable that the preset region is an electrode pad or a solder bump of the semiconductor device.

In still another exemplary embodiment, there is provided a position inspecting unit provided above a semiconductor wafer in order to inspect in advance a contact position of a probe needle with respect to an electrode pad or a solder bump of a semiconductor device formed on the semiconductor wafer when inspecting electrical characteristics of the semiconductor device by bringing the probe needle into contact with the electrode pad or the solder bump. Here, the position inspecting unit includes an imaging unit; and a holding substrate configured to hold the imaging unit. Further, the imaging unit includes a glass substrate, placed instead of the probe needle at a position where the probe needle is arranged, on which a shape indicating a position of the probe needle is formed; and an imaging device configured to image the semiconductor device formed on the semiconductor wafer through the glass substrate.

Effect of the Invention

According to the exemplary embodiments, when performing a contact type inspection by a probe needle on a preset region of an inspection target chip formed on an inspection target substrate, a contact position between the preset region and the probe needle is inspected in advance. For the purpose, a glass substrate on which a shape indicating a position of the probe needle to be brought into contact with the inspection target substrate is formed is placed, instead of the probe needle at a position where the probe needle is arranged, and the inspection target chip formed on the inspection target substrate is imaged through the glass substrate. Further, a positional relationship between the shape formed on the glass substrate and the preset region of the inspection target chip is analyzed based on the obtained image.

Accordingly, when performing the contact type inspection on the inspection target chip, the inspection of the contact accuracy and the determination of the acceptability thereof can be performed in advance on more accurate sub-micron level with non-contact manner. Further, the position deviation between the shape (pattern) formed on the glass substrate and the preset region formed on the inspection target substrate can be quantitatively analyzed. Furthermore, since no needle mark caused by the probe needle is left on the preset region, unlike in the conventional cases, it is possible to determine the acceptability of the contact accuracy by using the inspection target substrate without using the reference substrate.

DETAILED DESCRIPTION

In the following, an exemplary embodiment will be described in detail, and reference is made to the accompanying drawings, which form a part of the description. In the present exemplary embodiment, there will be described a position accuracy inspecting apparatus configured to perform a pre-processing for inspecting electrical characteristics of a semiconductor device formed on a wafer by a prober. In this pre-processing, the position accuracy inspecting apparatus of the present exemplary embodiment inspects whether a region of electrode pads or the like of the semiconductor device formed on the wafer is positioned within an allowable region with respect to probe needles (probes) provided at a probe card. Further, when necessary, the position accuracy inspecting apparatus corrects coordinates of a stage (substrate placing table) for placing the wafer thereon with respect to positions of the probe needles.

In consideration of such purpose and operation of the position accuracy inspecting apparatus, the position accuracy inspecting apparatus of the present exemplary embodiment is adopted to have a structure in which the probe card of the prober is replaced with a position inspecting unit to be described later. Here, a schematic configuration of the prober will be first explained, and the position accuracy inspecting apparatus modified from the prober will be then described.

Figure 1:
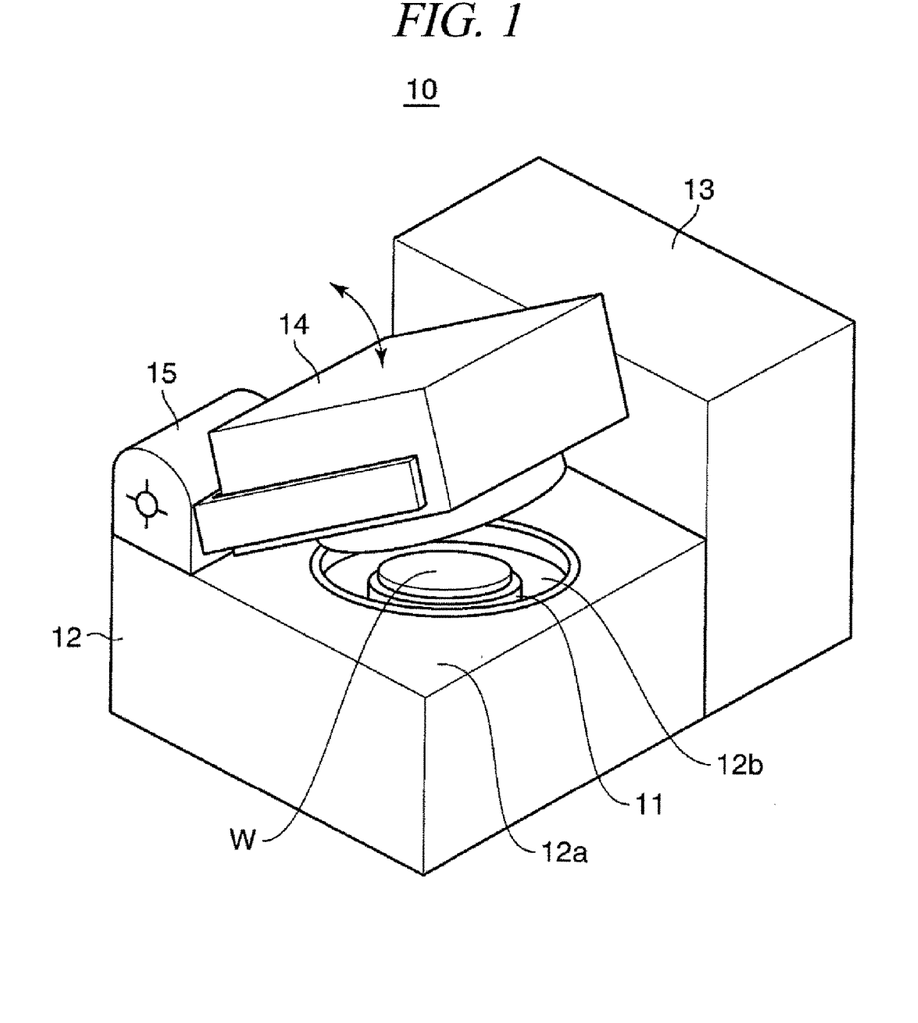
FIG. 1 is a perspective view illustrating a schematic configuration of a prober.

FIG. 1 is a perspective view illustrating a schematic configuration of the prober. The prober 10 includes a main body 12 incorporating therein a stage 11 (substrate placing table) configured to place a wafer W thereon; a loader 13 provided adjacent to the main body 12; and a test head 14 (inspecting unit) provided to cover the main body 12. This prober 10 is configured to inspect electrical characteristics of a semiconductor device formed on the wafer W having a large diameter of, for example, 300 mm or 450 mm.

The main body 12 has a hollow housing shape. At a ceiling portion 12a of main body 12, an opening 12b which is opened above the wafer W placed on the stage 11. A probe card 17 (see FIG. 2) to be described later is placed in the opening 12b, and the probe card 17 faces the wafer W. The wafer W is electrostatically attracted to and held by the stage 11 such that a relative position of the wafer to the stage 11 is not deviated.

The test head 14 has a hexahedron shape and is configured to be rotatable in an upward direction by a hinge mechanism 15 provided on the main body 12. When the test head 14 covers the main body 12, the test head 14 is electrically connected to the probe card 17 via a non-illustrated contact ring. Furthermore, the test head 14 has a non-illustrated data storage unit configured to store, as measurement data, electrical signals which are sent from the probe card 17 and indicate electrical characteristics of the semiconductor device. The test head 14 is also equipped with a non-illustrated determination unit configured to determine, based on the measurement data, presence or absence of an electrical defect of the semiconductor device of the wafer W as an inspection target.

The loader 13 is configured to take out the wafer W, on which the semiconductor device is formed, accommodated in a MAC or a FOUP (not illustrated) which is a delivery container of the wafer W. Further, upon the completion of inspection of the electrical characteristics of the semiconductor device, the loader 13 carries out the inspected wafer W from the stage 11 and returns the wafer W back into the MAC or the FOUP.

A preset number of probe needles (not shown) are arranged on a bottom surface of the probe card 17 to correspond to electrode pads or solder bumps of the semiconductor device formed on the wafer W. The stage 11 allows the electrode pads or the like of the semiconductor device to be brought into contact with the corresponding probe needles by adjusting the relative positions between the probe card 17 and the wafer W.

When the electrode pads or the like of the semiconductor device are brought into contact with the probe needles, the test head 14 flows an inspection current to the semiconductor device via the respective probe needles of the probe card 17. Then, electrical signals indicating the electrical characteristics of the semiconductor device is sent to the data storage unit of the test head 14. The data storage unit of the test head 14 stores the received electrical signals as the measurement data, and the determination unit determines, based on the stored measurement data, whether or not the semiconductor device as the inspection target has an electrical defect.

The probe needles of the probe card 17 need to correspond to positions of the electrode pads or the solder bumps of the semiconductor device formed on the wafer W as the inspection target. For this reason, the probe card 17 is configured to be replaceable depending on the shape of the semiconductor device formed on the wafer W as the inspection target.

Figure 2:
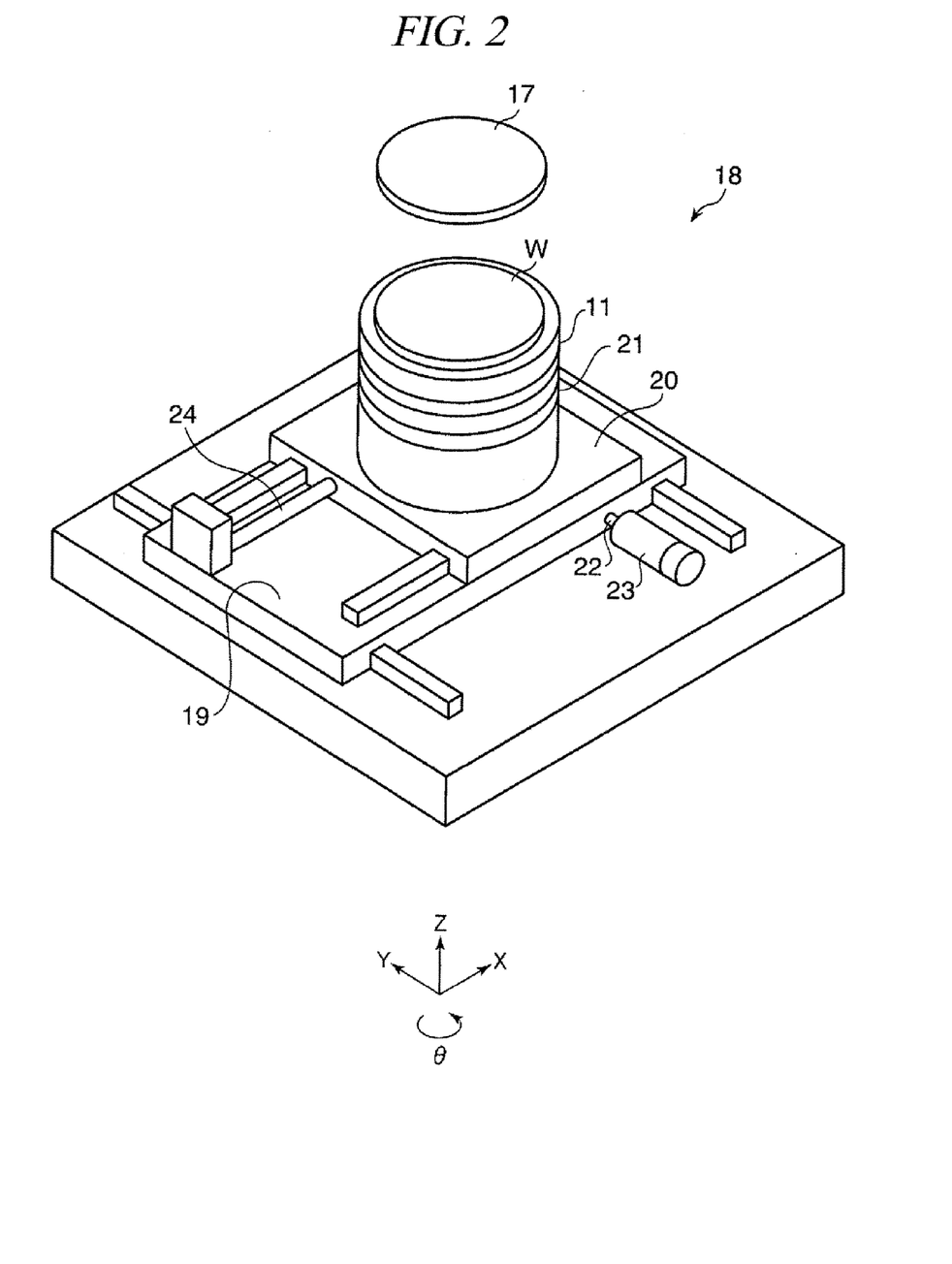
FIG. 2 is a perspective view illustrating a schematic structure of a stage provided in the prober of FIG. 1 and a driving mechanism of the stage.

FIG. 2 is a perspective view illustrating a schematic configuration of a driving mechanism of the stage 11 provided in the prober 10. As depicted in FIG. 2, the driving mechanism 18 of the stage 11 includes a Y-stage 19 configured to be moved along the Y direction shown in FIG. 2; an X-stage 20 configured to be moved along the X direction shown in the FIG. 2; and a Z-directional moving unit 21 configured to be moved along the Z direction shown in FIG. 2.

The Y-stage 19 is driven in the Y direction with high accuracy by a rotary motion of a ball screw 22 provided along the Y direction. The ball screw 22 is rotated by a Y-stage motor 23 which is a step motor. The X-stage 20 is driven in the X direction with high accuracy by a rotary motion of a ball screw 24 provided along the X direction. The ball screw 24 is rotated by an X-stage motor 25 of FIG. 3B to be described later, and this X-stage motor 25 is also a step motor. Further, the stage 11 is configured to be movable in a θ direction shown in FIG. 2 on the Z-directional moving unit 21 by a θ-rotation motor 26 of FIG. 3B to be described later, and the wafer W is placed on this stage 11.

The Y-stage 19, the X-stage 20, the Z-directional moving unit 21 and the stage 11 cooperate to move the semiconductor device formed on the wafer W to a position facing the probe card 17, so that the electrode pads or the like of the semiconductor device are allowed to be brought into contact with the probe needles. Driving of the Y-stage motor 23, the X-stage motor 25 and the θ-rotation motor 26 is controlled by a motor control device 27 of FIG. 3B to be described later.

Figure 3A:
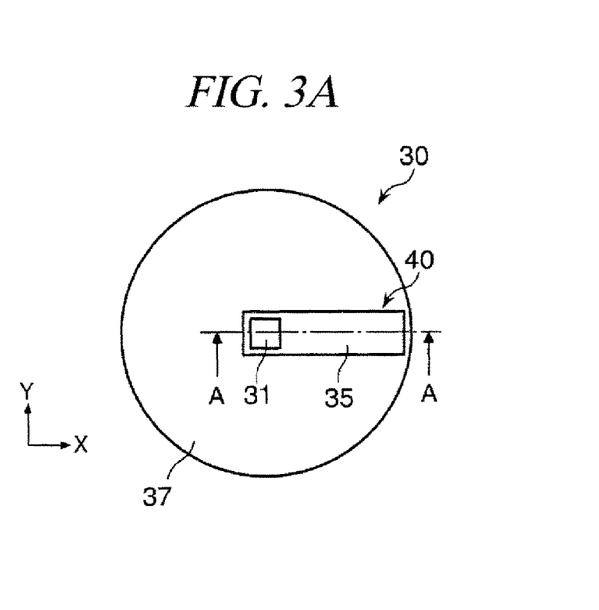
FIG. 3A is a diagram illustrating a schematic configuration of a position inspecting unit which is detachably attached to the prober of FIG. 1.
Figure 3B:
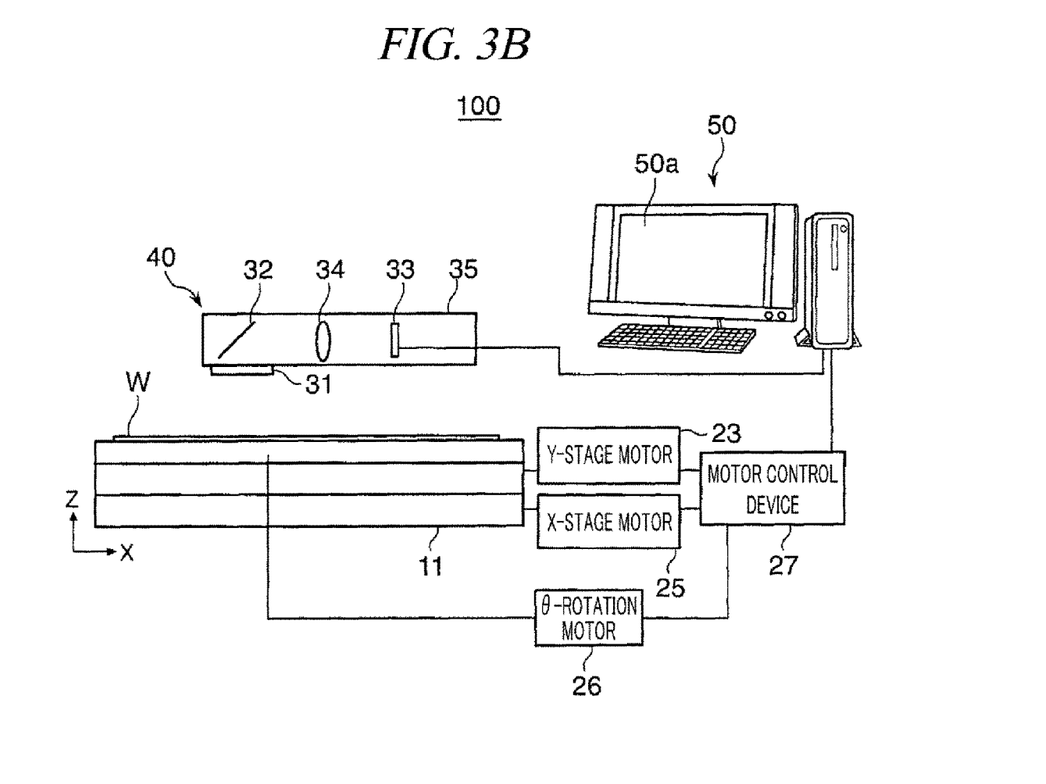
FIG. 3B is a diagram illustrating a schematic configuration of a position accuracy inspecting apparatus according to an exemplary embodiment.

Now, a configuration and an operation method of the position accuracy inspecting apparatus 100 according to the exemplary embodiment will be discussed. FIG. 3A is a rear view illustrating a schematic configuration of a position inspecting unit 30 of the position accuracy inspecting apparatus 100 according to the exemplary embodiment. FIG. 3B is a diagram illustrating a schematic configuration of the position accuracy inspecting apparatus 100 according to the exemplary embodiment.

The position accuracy inspecting apparatus 100 has a configuration in which the probe card 17 provided to the prober 10 described with reference to FIG. 1 and FIG. 2 is separated, and the position inspecting unit 30 shown in FIG. 3A is provided to the prober 10 instead of the probe card 17. In this position accuracy inspecting apparatus 100, an image signal output from an imaging unit 40 provided in the position inspecting unit 30 is image-analyzed by a computer 50. In FIG. 3B, a cross sectional view of the imaging unit 40 taken along a line A-A of FIG. 3A is illustrated. Further, the function of the computer 50 may be implemented by a computer configured to control an operation of the prober 10.

In the prober 10, the probe card 17 is held by the main body 12 while its position is determined with very high accuracy. Likewise, the position inspecting unit 30 is also held by the main body 12 while its position is determined. The position inspecting unit 30 is equipped with a holding substrate 37 and the imaging unit 40. An outer diameter of the holding substrate 37 is equal to an outer diameter of the probe card 17. A method of holding the imaging unit 40 by the holding substrate 37 is not particularly limited as long as the holding position of the imaging unit 40 with respect to the holding substrate 37 is stable and the position deviation therebetween does not occur.

In FIG. 3B, the imaging unit 40 includes a housing 35, a reticle 31, a mirror 32, an imaging device 33 and a lens 34. In the state that the housing 35 having a hollow column shape is held on the holding substrate 37 of FIG. 3A, a window portion is formed at a portion of the housing 35 corresponding to a center of the holding substrate 37. The reticle 31 is provided to the housing 35 to close this window portion.

Figure 4A:
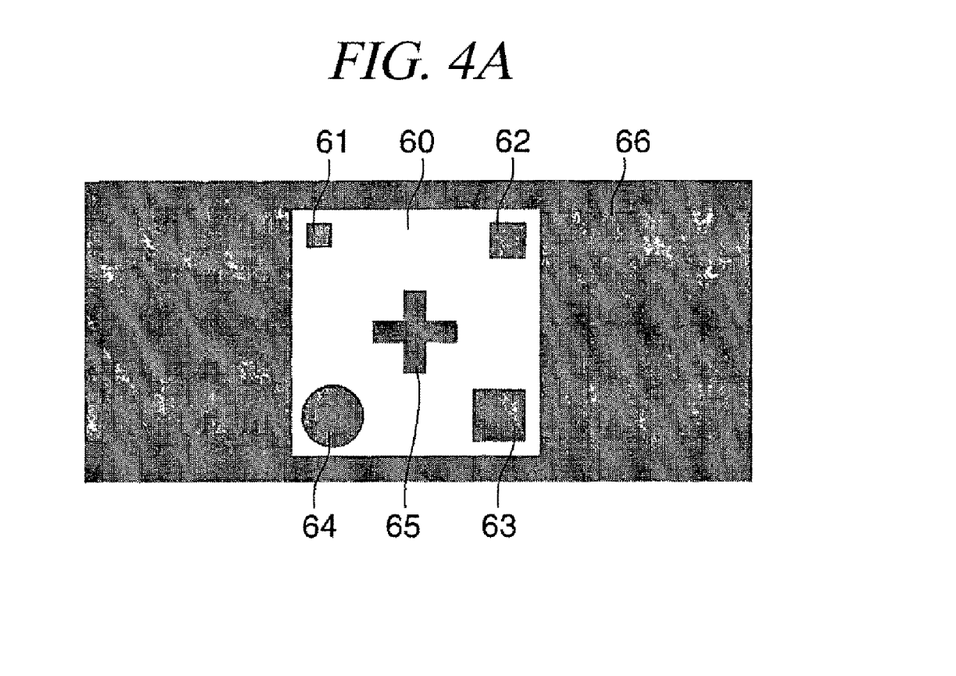
FIG. 4A and FIG. 4B are diagrams schematically illustrating the content of an image processing as a first operation method of the position accuracy inspecting apparatus according to the exemplary embodiment.

The reticle 31 is a light transmitting glass substrate. The reticle 31 is provided with shapes (patterns) corresponding to the shapes of the electrode pads or the solder bumps of the semiconductor device as the inspection target, as illustrated in FIG. 4A to be described later. The reticle 31 is replaceable according to the shape of the semiconductor device to be inspected.

The mirror 32 reflects light, which has reached the inside of the housing 35 through the reticle 31 and the window portion, toward the imaging device 33. The lens 34 adjusts an optical path such that the light from the mirror 32 is focused on the imaging device 33 as an optical image. The imaging device 33 is implemented by a CCD sensor or a CMOS sensor, and is configured to image, through the reticle 31, the semiconductor device formed on the wafer W which is placed on the stage 11.

The computer 50 is connected to the imaging unit 40 and the motor control device 27. An image signal (analog electrical signal) output from the imaging device 33 by an imaging operation of the imaging device 33 is input to the computer 50. The computer 50 includes an A/D converter (not shown) configured to convert the analog electrical signal into a digital signal. After the A/D conversion, the computer 50 generates image data composed of the digital signal. The computer 50 also performs image processing on the image data and visually displays the processed image as a picture (image) on a display 50a provided in the computer 50.

A position control in the horizontal direction of the stage 11 on which the wafer W is placed is performed based on pulse numbers of encoders respectively provided at the Y-stage motor 23 and the X-stage motor 25. Accordingly, the stage 11 is moved on X-Y coordinates which are managed based on the pulse numbers of the encoders. The motor control device 27 controls the position of the stage 11 on the X-Y coordinates by outputting driving signals to the Y-stage motor 23 and the X-stage motor 25 under the control of the computer 50. Further, an operation of rotating the stage 11 in the θ direction (Z-axis direction) shown in FIG. 2 is performed by controlling driving of the θ-rotation motor 26. The motor control device 27 controls the driving of the θ-rotation motor 26 by outputting a driving signal to the θ-rotation motor 26 under the control of the computer 50.

In the position inspecting unit 30, a center of the reticle 31 and a center of the holding substrate 37 are coincident with high precision in the state that the imaging unit 40 is held on the holding substrate 37. Further, a position where the reticle 31 is mounted precisely coincides with a position where the probe needles are arranged on the probe card 17. That is, if the probe card 17 and the position inspecting unit 30 are overlapped in a thickness direction thereof such that outer peripheries thereof are coincident, a region where the probe needles are arranged and a region of the reticle 31 are overlapped with each other when viewed from the thickness direction. The imaging unit 40 images the wafer W while observing the wafer W placed on the stage 11 from directly above the stage 11 through the reticle 31. Resultantly, the imaging unit 40 observes the semiconductor device as the inspection target from the position of the probe card 17 where the probe needles are provided. Accordingly, based on the image obtained by imaging the semiconductor device formed on the wafer W through the reticle 31 after forming the shapes (patterns) on positions of the reticle 31 corresponding to the probe needles, it is possible to inspect and determine whether the electrode pads or the solder bumps of the semiconductor device are located at the positions where they can be brought into contact with the probe needles.

Now, a first operation method of the position accuracy inspecting apparatus 100 will be explained. In the first operation method of the position accuracy inspecting apparatus 100, by using the wafer W as the inspection target of the electrical characteristics, it is determined whether the positions of the electrode pads or the solder bumps of the semiconductor device formed on the wafer W and the patterns formed on the reticle 31 are coincident within a preset accuracy range.

Figure 4B:
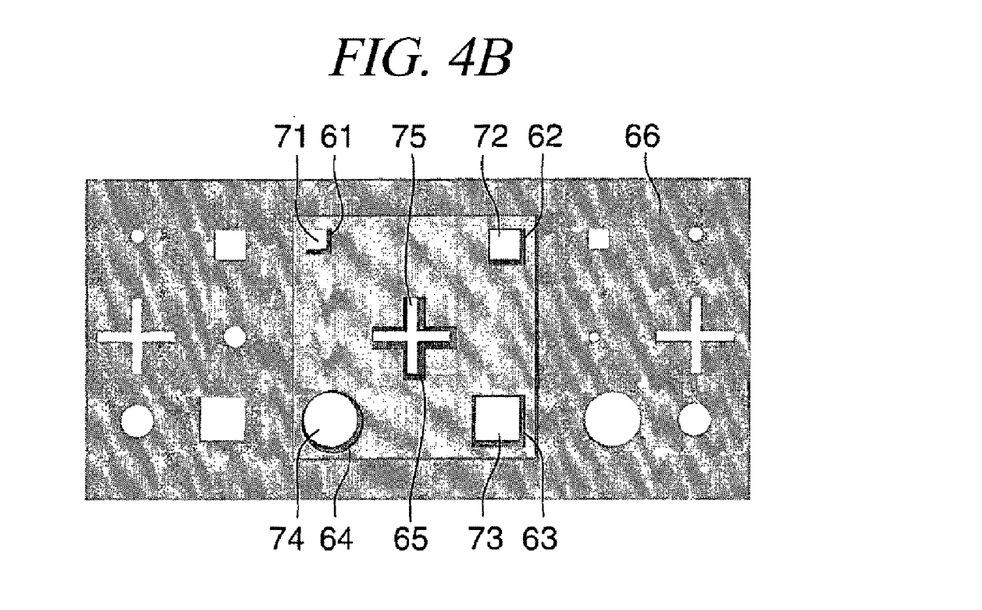

FIG. 4A and FIG. 4B are diagrams schematically showing the content of image processing performed by the computer 50 in the first operation method of the position accuracy inspecting apparatus 100. FIG. 4A illustrates an example of an image obtained by the imaging device 33 in a state that the wafer W is not placed on the stage 11. Since the imaging device 33 images a top surface of the stage 11 through the reticle 31, the patterns formed on the reticle 31 appear on the obtained image. In the image of FIG. 4A, the image processing is performed such that a region of the reticle 31 where a large amount of light is transmitted is shown in gray, and a region thereof where a relatively small amount of light is transmitted is shown in white (a region of the color of a paper on which FIG. 4A is shown).

A region 66 is a region displayed on the display 50a and indicates an entire region that can be imaged by the imaging unit 40. A region 60 is a region indicating shape patterns of the semiconductor device formed on the reticle 31. Within the region 60, shapes 61, 62, 63, 64 and 65 are displayed according to the shape patterns formed on the reticle 31.

Centers of the shapes 61 to 65 respectively correspond to positions of the probe needles. A region of the reticle 31 corresponding to the region (region shown in gray) of each of the shapes 61 to 65 is a region which is transparent and well-transmits light. Further, a region corresponding to a region (region shown in gray) of the region 66 except the region 60 is the same. Meanwhile, a region of the reticle 31 corresponding to a region (region of the color of the paper of FIG. 4A) of the region 60 except the shapes 61 to 65 exhibits a smaller light transmittance than the regions of the shapes 61 to 65.

Then, the wafer W is placed on the stage 11, and the semiconductor device is observed by the imaging unit 40. The wafer W is aligned with the stage 11 and is held at a certain position. A position (coordinates) of the semiconductor device formed on the wafer W is previously known from setting conditions in a manufacturing process, and the holding position of the wafer W on the stage 11 is also known from a mechanical configuration of the position accuracy inspecting apparatus 100 (prober 10). Further, coordinates of the reticle 31 (coordinates of probe needles) with respect to the coordinates of the stage 11 are also known. Accordingly, the stage 11 can be driven such that the semiconductor device as the inspection target is located directly under the reticle 31.

FIG. 4B illustrates an example of an image of a preset semiconductor device obtained by the imaging device 33 in the state that the wafer W is placed on the stage 11. The semiconductor device includes electrode pads 71 to 74 corresponding to the shapes 61 to 64. Through the image processing by the computer 50, the electrode pads 71 to 74 are shown in white (color of the paper) in FIG. 4B.

The shapes 61 to 64 are set to be respectively analogous to shapes of the electrode pads 71 to 74. Sizes of the shapes 61 to 64 are set to be slightly larger than sizes of the electrode pads 71 to 74. Accordingly, even when the shapes 61 to 64 and the electrode pads 71 to 74 are overlapped in any various ways, coordinates of the center of each of the shapes 61 to 64 and coordinates of the center of each of the electrode pads 71 to 74 can be calculated by the image processing while being distinguished.

Further, though the shape 65 is not completely analogous to the shape of the electrode pad 75, the electrode pad 75 is set to have a size contained in the shape 65 in the state that the center coordinates of the shape 65 and the center coordinates of the electrode pad 75 are coincident. Further, the shapes formed on the reticle 31 need not necessarily be analogous to the shapes of the electrode pads or the solder bumps and just need to be distinguishable from the electrode pads or the solder bumps even if they are overlapped with the electrode pads or the solder bumps when imaged by the imaging unit 40 as will be described later.

As discussed above, the centers of the shapes 61 to 64 respectively correspond to the positions of the probe needles. Thus, when observing the semiconductor device formed on the wafer W, if the centers of the shapes 61 to 64 are located within the respective regions of the electrode pads 71 to 74 of the semiconductor device, contact between the electrode pads 71 to 74 and the probe needles in the prober 10 is secured. In FIG. 4B, the centers of the shapes 61 to 64 are located within the respective regions of the electrode pads 71 to 74.

If, however, the centers of the shapes 61 to 64 are located in the vicinity of outer peripheries of the regions of the electrode pads 71 to 74 of the semiconductor device, the electrode pads 71 to 74 may not be brought into secure contact with the probe needles. In this regard, in order to determine whether the electrode pads 71 to 74 of the semiconductor device are positioned within an allowable region with respect to the probe needles (to determine whether the contact accuracy between the probe needles and the electrode pads or the solder bumps formed on the semiconductor device (hereinafter, simply referred to as "contact accuracy") is acceptable), a determination criterion in a positional relationship between the shapes 61 to 64 and the electrode pads 71 to 74 is provided. When this determination criterion is satisfied, the contact accuracy is determined to be acceptable, whereas when this determination criterion is not met, the contact accuracy is determined to be unacceptable.

The determination criterion in the positional relationship between the shapes 61 to 64 and the electrode pads 71 to 74 are not particularly limited. By way of example, if the electrode pads 71 to 74 are included in the respective regions of the shapes 61 to 64, the contact accuracy may be determined to be acceptable. According to this determination criterion, the state of FIG. 4B is found to be acceptable. As another example of the determination criterion, if distances between the centers of the electrode pads 71 to 74 and the centers of the shapes 61 to 64 are within a preset threshold value Th, the contact accuracy may be determined to be acceptable.

If the contact accuracy for a single semiconductor device is found to be acceptable, it is not needed to determine whether the contact accuracy for another semiconductor device is acceptable because the position control is precisely conducted in the manufacturing process of the semiconductor devices. However, it may be also possible to check whether the contact accuracy for a plurality of semiconductor devices are acceptable individually. As a result of determining whether the contact accuracy for the plurality of semiconductor devices are acceptable, if there is found any semiconductor device having unacceptable contact accuracy, position correction of the stage 11 is performed according to a second operation method of the position accuracy inspecting apparatus 100 to be described later.

According to the first operation method of the position accuracy inspecting apparatus 100 as described above, the inspection of the contact accuracy and the determination of the acceptability thereof are enabled on a sub-micron level which is more accurate than that in the conventional cases. Further, a position deviation between the shapes formed on the reticle 31 and the electrode pads or the like formed on the wafer W can be quantitatively analyzed by the image processing. Furthermore, since no needle mark caused by the probe needles is left on the electrode pads or the like, unlike in the conventional cases, it is possible to determine the acceptability of the contact accuracy by using the wafer W to be inspected without using the reference wafer.

If the contact accuracy for the semiconductor device inspected according to the above-described first operation method of the position accuracy inspecting apparatus 100 is determined to be acceptable, the position accuracy inspecting apparatus 100 is changed to the prober 10 by replacing the position inspecting unit 30 with the probe card 17 in order to inspect the electrical characteristics of the wafer W with the prober 10, and the operation of the position accuracy inspecting apparatus 100 as the prober 10 is begun. Meanwhile, if it is determined that the contact accuracy for the inspected semiconductor device is unacceptable, the position correction (coordinates correction) of the stage 11 is performed to satisfy the determination criterion. This operation will be elaborated below as a second operation method of the position accuracy inspecting apparatus 100.

The second operation method of the position accuracy inspecting apparatus 100 is performed after the above-described first operation method of the position accuracy inspecting apparatus 100. Here, it is assumed that since the contact accuracy is determined to be unacceptable in the positional relationship between the shapes 61 to 64 and the electrode pads 71 to 74 shown in FIG. 4B, the position correction of the stage 11 is performed.

Figure 5A:
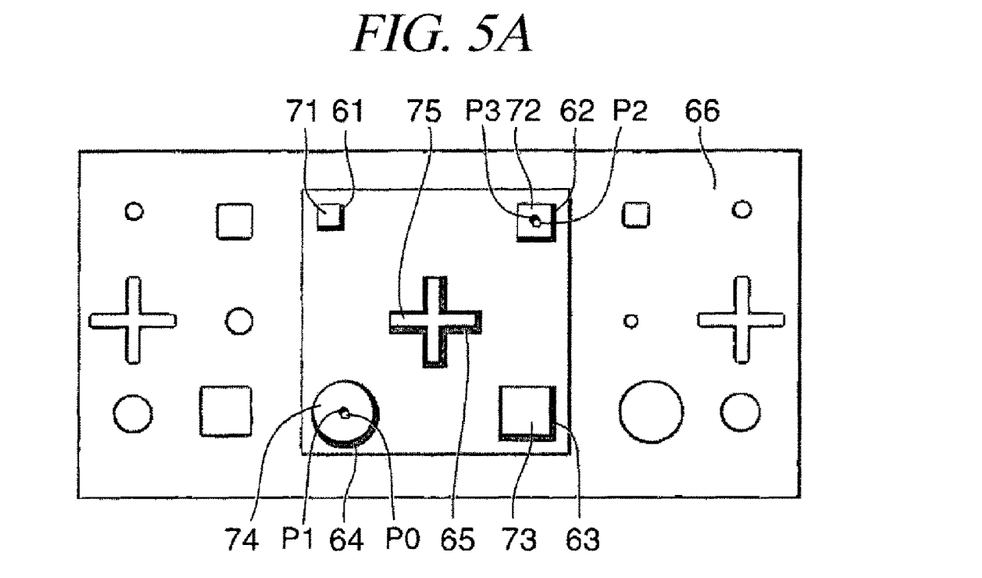
FIG. 5A and FIG. 5B are diagrams schematically illustrating the content of an image processing as a second operation method of the position accuracy inspecting apparatus according to the exemplary embodiment.

FIG. 5A and FIG. 5B are diagrams schematically illustrating the content of an image processing performed by the computer 50 in the second operation method of the position accuracy inspecting apparatus 100. In FIG. 5A, the positional relationship between the shapes 61 to 65 and the electrode pads 71 to 75 is the same as in FIG. 4B. For the position correction of the stage 11 on the X-Y plane, deviations in X, Y and θ directions need to be corrected. Thus, the centers of the shapes and the centers of the electrode pads need to be made coincident at two positions at minimum. Here, the centers (white rectangles) of the diagonally arranged shapes 62 and 64 and the centers (black circles) of the electrode pads 72 and 74 are made coincident by the image processing.

Figure 5B:
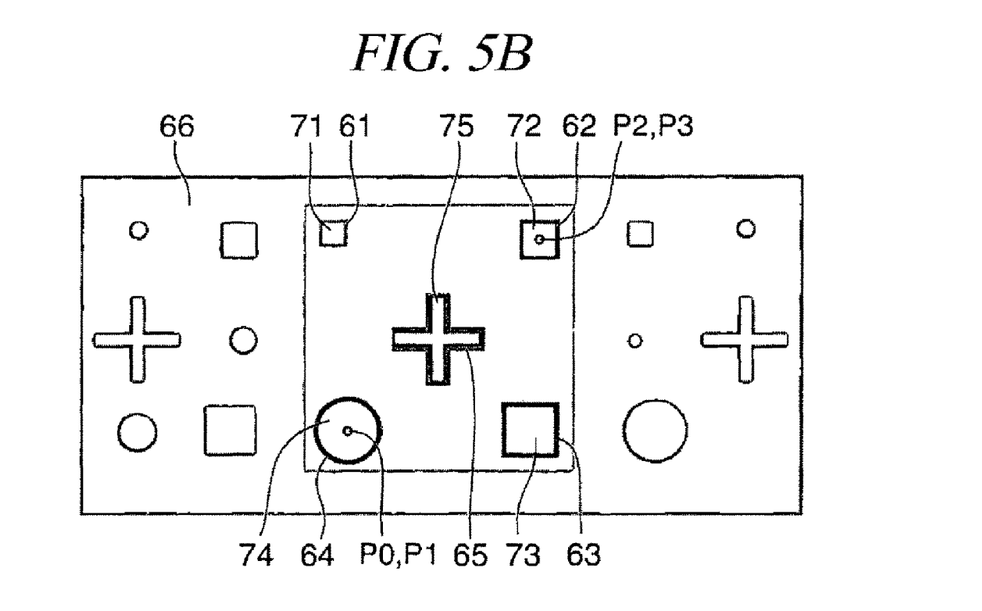

In FIG. 5B, assume that coordinates (x0, y0) of the center P0 of the shape 64, coordinates (x1, y1) of the center P1 of the electrode pad 74, coordinates (x2, y2) of the center P2 of the shape 62 and coordinates (x3, y3) of the center P3 of the electrode pad 72 are calculated by the image processing. Then, a rotation correction angle θ0 of the centers P0 and P1 and a rotation correction angle θ1 of the centers P1 and P3 are calculated with respect to the X-axis (or Y-axis). Then, a θ correction amount (=θ0 θ1) is calculated from the rotation correction angles θ0 and θ1 as a difference of the rotation correction angles, and the computer 50 stores the calculated θ correction amount. Subsequently, the computer 50 outputs a signal for driving the θ rotation motor 26 to the motor control device 27, and rotates the stage 11 by the θ correction amount. As a result, a line connecting P0 and P2 and a line connecting P1 and P3 are made parallel to each other and the correction in the θ direction is ended.

By the correction in the θ direction, the coordinates of the centers P1 and P3 are respectively changed to P1′(x1′, y1′) and P3′(x3′, y3′). The centers P0 and P2 are not changed. From the coordinates of P0 and P1′, a first X-direction correction amount (ΔX1) (=x0−x1′) and a first Y-direction correction amount (ΔY1) (=y0−y1′) are calculated. Further, from the coordinates of P2 and P3′, a second X-direction correction amount (ΔX2) (=x2−x3′) and a second Y-direction correction amount (ΔY2) (=y2−y3′) are calculated.

Ideally, ΔX1=ΔX2, and ΔY1=ΔY2 are achieved. However, in the calculation process of the image processing, a minute difference may be generated. In such a case, an average of ΔX1 and ΔX2 and an average of ΔY1 and ΔY2 need to be used as an X-direction correction amount ΔX and a Y-direction correction amount ΔY. Here, the exemplary embodiment is not limited to the above, and whichever smaller or larger one of ΔX1 and ΔX2 (ΔY1 and ΔY2), not the average thereof, may be used. The computer 50 stores the calculated X-direction correction amount ΔX and the Y-direction correction amount ΔY. The computer 50 outputs signals for driving the X-stage motor 25 and the Y-stage motor 23 to the motor control device 27 such that P1′ is made coincident with P0 and P3′ is made coincident with P2. After the stage 11 is driven by the X-direction correction amount ΔX and the Y-direction correction amount ΔY, it is determined whether the contact accuracy is acceptable according to the above-described first operation method.

FIG. 5B shows the positional relationship between the shapes 61 to 65 and the electrode pads 71 to 75 after the correction in the θ direction, the correction in the X direction and the correction in the Y direction are performed. As can be seen from this figure, the coordinates of the stage 11 (position of the wafer W) is corrected such that the coordinates of the centers of the shapes 61 to 65 and the coordinates of the centers of the electrode pads 71 to 75 are respectively coincident, and the electrode pads 71 to 75 are respectively located at the centers of the shapes 61 to 65. As a result, the contact accuracy is determined to be acceptable.

Thus, the processing can proceed to the inspection of the electrical characteristics with respect to the wafer W by the prober 10. In the inspection of the electrical characteristics of the semiconductor device in the prober 10, the position of the wafer W with respect to the probe needles is corrected by using the correction parameters (the θ correction amount, the X-direction correction amount ΔX and the Y-direction correction amount ΔY) calculated by the second operation method of the position accuracy inspecting apparatus 100. Accordingly, the probe needles are allowed to come into secure contact with the electrode pads or the solder bumps of the semiconductor device formed on the wafer W.

Further, in the above description, the centers of the shapes 62 and 64 and the centers of the electrode pads 72 and 74 as two diagonally arranged positions are made to be coincident. However, the exemplary embodiments are not limited thereto, and centers of other two shapes may be made coincident, or three or more centers may be made coincident with preset accuracy. Furthermore, in this exemplary embodiment, in case that contact accuracy is found to be unacceptable in the first operation method of the position accuracy inspecting apparatus 100, the position correction of the stage 11 according to the second operation method is performed. However, the exemplary embodiment may not be limited to this example. By way of example, even in case that the contact accuracy is determined to be acceptable, the position correction of the stage 11 according to the second operation method may be performed if the centers of the shape and the centers of the electrode pads are not coincident with preset accuracy (accuracy higher than the determination criterion).

Now, a third operation method of the position accuracy inspecting apparatus 100 will be explained. In the third operation method of the position accuracy inspecting apparatus 100, the determination of the acceptability of the contact accuracy described in the first operation method of the position accuracy inspecting apparatus 100 is performed on a plurality of semiconductor devices formed on the wafer W in sequence while scanning the stage 11 in the X direction and in the Y direction individually.

By way of example, even if the contact accuracy of a semiconductor device at an initial measurement point is acceptable, the contact accuracy of a semiconductor device at a measurement point, which is moved by a preset distance in the X direction or Y direction, may be unacceptable due to a component accuracy or an assembly accuracy, abrasion or wobbling of a component caused by sliding movement with the lapse of time, occurrence of a deviation of a semiconductor device forming position on the wafer W or the like.

In such a case, coordinates of the semiconductor device having the unacceptable contact accuracy is stored, and the position correction of the stage 11 as described in the second operation method of the position accuracy inspecting apparatus 100 is performed on that semiconductor device. Thereafter, the determination of acceptability upon the contact accuracy as described in the first operation method of the position accuracy inspecting apparatus 100 is continued for the rest semiconductor devices in the X and Y directions. Data of driving characteristics of the stage 11 obtained through this process is used in driving the stage 11 when inspecting the electrical characteristics in the prober 10. As a result, the probe needles can be brought into secure contact with the electrode pads of the semiconductor devices formed on the wafer W. Further, it can also be inspected whether the stage 11 is accurately driven in the X and Y directions.

Further, the determination of the acceptability of the contact accuracy may be performed for all the semiconductor devices formed on the wafer W according to the third operation method, and a driving profile of the stage 11 (including the position correction of the stage 11) in which all the semiconductor devices have the acceptable contact accuracy may be stored in the computer 50, and the inspection of the electrical characteristics in the prober 10 may be performed by using the stored driving profile of the stage 11.

Now, a fourth operation method of the position accuracy inspecting apparatus 100 will be explained. In the fourth operation method of the position accuracy inspecting apparatus 100, the determination of the acceptability of the contact accuracy according to the first operation method of the position accuracy inspecting apparatus 100 is performed for two or more semiconductor devices without moving the stage 11 (wafer W).

Figure 6:
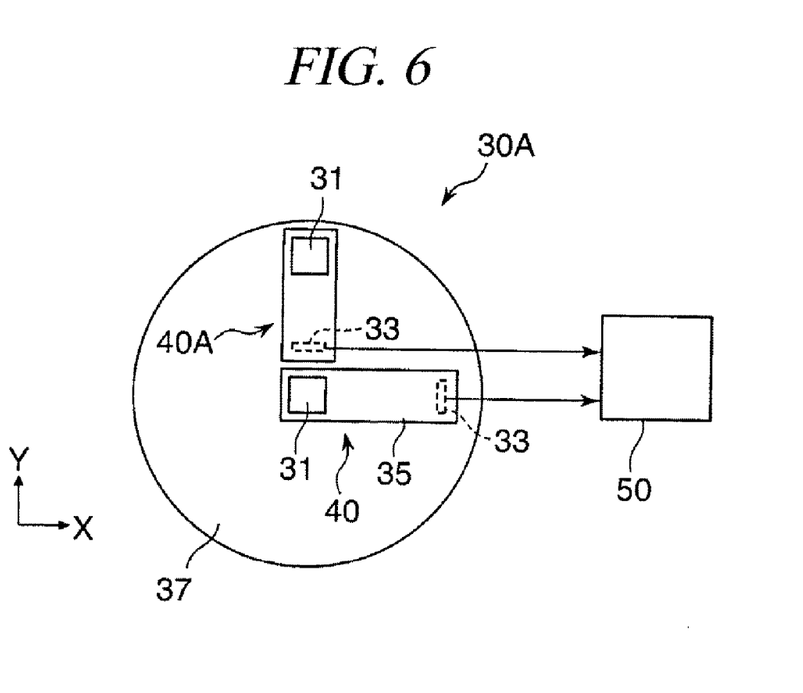
FIG. 6 is a rear view illustrating a schematic configuration of a position inspecting unit used to implement a fourth operation method of the position accuracy inspecting apparatus according to the exemplary embodiment.

FIG. 6 is a rear view illustrating a schematic configuration of a position inspecting unit 30A for use in implementing the fourth operation method of the position accuracy inspecting apparatus 100. The position inspecting unit 30A is equipped with two imaging units 40 and 40A having the same structure. In the position inspecting unit 30A, the positions where the reticles 31 of the imaging units 40 and 40A are located are aligned with the positions of semiconductor devices formed on the wafer W to be inspected. By determining the acceptability of the contact accuracy for the semiconductor devices at the two positions, the determination accuracy can be improved. Furthermore, in case that the contact accuracy is found to be unacceptable for at least one semiconductor device, the position correction of the stage 11 according to the second operation method of the position accuracy inspecting apparatus 100 is performed.

Besides, in the position inspecting unit 30A, the reticles 31 are located at the center and the peripheral portion of the holding substrate 37. However, the arrangement positions of the reticles 31, that is, the observation positions of the semiconductor devices formed on the wafer W are not limited to this example, and the imaging units 40 and 40A may be held on the holding substrate 37 such that the reticles 31 (observations positions) are located at any two positions. Furthermore, three or more imaging units may be arranged on the holding substrate 37.

In the above, the exemplary embodiments have been described. However, the exemplary embodiment is not limiting, and various changes and modifications may be made. For example, by performing the first operation method on the reference wafer, coordinates accuracy of the stage 11 or alignment accuracy of the wafer W with respect to the stage 11 may be inspected without leaving the needle mark on the reference wafer W. Here, the reference wafer W is a wafer on which the semiconductor device equivalent to that of the wafer W as the inspection target of the electrical characteristics by the prober 10 (see FIG. 1 and FIG. 2) is formed. In this reference wafer, a position (coordinates) where the semiconductor device is formed is already known.

This application claims priority to Japanese Patent Application No. 2014-200912, filed on Sep. 30, 2014, which application is hereby incorporated by reference in its entirety.

EXPLANATION OF REFERENCE NUMERALS 30, 30A: Position inspecting unit
31: Reticle
33: Imaging device
40, 40A: Imaging unit
61, 62, 63, 64, 65: Shape
71, 72, 73, 74, 75: Electrode pad
100: Position accuracy inspecting apparatus

We claim:

1. A position accuracy inspecting method performed prior to performing a contact type inspection, wherein the contact type inspection is to be performed by using a probe needle on a preset region of at least one inspection target chip formed on an inspection target substrate, the position accuracy inspecting method comprising:
 a placement process of placing the inspection target substrate on a substrate placing table;
 an imaging process of placing, at a height distanced apart from the inspection target substrate, a glass substrate on which a shape corresponding to the probe needle is formed, and imaging the at least one inspection target chip, including the preset region, formed on the inspection target substrate through the glass substrate from above the inspection target substrate while the glass substrate is not in contact with the inspection target substrate;
 an analysis process of analyzing a positional relationship between the shape and the preset region from at least one image obtained by the imaging process; and
 a determination process of determining whether the probe needle is allowed to be brought into contact with the preset region based on the positional relationship between the shape and the preset region obtained by the analysis process,
 wherein the preset region analyzed by the analysis process is the same as the preset region where the probe needle is allowed to be brought into contact after the analysis process.

2. The position accuracy inspecting method of claim 1, wherein it is determined in the determination process that the probe needle is allowed to be brought into contact with the preset region when a distance between a center of the shape and a center of the preset region is within a preset threshold value.

3. The position accuracy inspecting method of claim 1, further comprising:
 a correction process of correcting, when it is determined in the determination process that a center of the shape and a center of the preset region is not coincident within preset accuracy, coordinates of the substrate placing table such that the center of the shape and the center of the preset region are coincident.

4. The position accuracy inspecting method of claim 3, wherein the at least one inspection target chip is plural in number,
 at least two or more inspection target chips formed on the inspection target substrate are imaged through the glass substrate without moving the substrate placing table in the imaging process, and wherein the at least one image is plural in number,
the analysis process and the determination process are performed on each of the obtained images, and the correction process is performed when it is determined that the center of the shape and the center of the preset region are not coincident within the preset accuracy for at least one image.

5. The position accuracy inspecting method of claim 1,
wherein the inspection target substrate is a semiconductor wafer,
the at least one inspection target chip is a semiconductor device, and
the preset region is an electrode pad or a solder bump of the semiconductor device.

6. The position accuracy inspecting method of claim 5, wherein the shape is analogous to shape of the electrode pad.

7. A position accuracy inspecting apparatus configured to inspect a contact position prior to performing a contact type inspection, wherein the contact type inspection is to be performed by using a probe needle on a preset region of an inspection target chip formed on an inspection target substrate, the position accuracy inspecting apparatus comprising:
   a substrate placing table configured to place the inspection target substrate thereon;
   at least one imaging unit disposed above the substrate placing table; and
   an analysis device configured to analyze an image obtained by the at least one imaging unit,
   wherein the at least one imaging unit comprises:
   a glass substrate, placed at a height distanced apart from the inspection target substrate, on which a shape corresponding to the probe needle is formed; and
   an imaging device configured to image the inspection target substrate placed on the substrate placing table through the glass substrate from above the inspection target substrate while the glass substrate is not in contact with the inspection target substrate,
   wherein the analysis device analyzes a positional relationship between the shape and the preset region from an image obtained by imaging the inspection target chip, including the preset region, formed on the inspection target substrate through the glass substrate, and
   the analysis device determines whether the probe needle is allowed to be brought into contact with the preset region based on the positional relationship between the shape and the preset region,
   wherein the preset region analyzed by the analysis device is the same as the preset region where the probe needle is allowed to be brought into contact after analyzing the positional relationship between the shape and the preset region.

8. The position accuracy inspecting apparatus of claim 7, wherein the at least one imaging unit is plural in number.

9. The position accuracy inspecting apparatus of claim 7, further comprising:
   a driving mechanism configured to move the substrate placing table in an in-plane direction parallel to a placing surface of the substrate placing table and configured to rotate the substrate placing table with respect to an axis orthogonal to the placing surface,
   wherein the analysis device controls, when it is determined that a center of the shape and a center of the preset region is not coincident within preset accuracy, the driving mechanism to correct coordinates of the substrate placing table such that the center of the shape and the center of the preset region are coincident.

10. The position accuracy inspecting apparatus of claim 7, wherein the inspection target substrate is a semiconductor wafer,
the inspection target chip is a semiconductor device, and
the preset region is an electrode pad or a solder bump of the semiconductor device.

11. The position accuracy inspecting apparatus of claim 10,
wherein the shape is analogous to shape of the electrode pad.

12. A position inspecting unit provided above a semiconductor wafer in order to inspect a contact position prior to performing a contact type inspection, wherein the contact type inspection is to be performed with respect to an electrode pad or a solder bump of a semiconductor device formed on the semiconductor wafer to inspect electrical characteristics of the semiconductor device by bringing a probe needle into contact with the electrode pad or the solder bump at the contact position,
   the position inspecting unit comprising:
   an imaging unit; and
   a holding substrate configured to hold the imaging unit,
   wherein the imaging unit comprises:
   a glass substrate, placed at a height distanced apart from the semiconductor wafer, on which a shape corresponding to the probe needle is formed;
   an imaging device configured to image the semiconductor device formed on the semiconductor wafer through the glass substrate from above the semiconductor wafer while the glass substrate is not in contact with the electrode pad or the solder bump; and
   an analysis device analyzes a positional relationship between the shape and the electrode pad or the solder bump from an image obtained by imaging the semiconductor device, including the electrode pad or the solder bump, and determines whether the probe needle is allowed to be brought into contact with the electrode pad or the solder bump,
   wherein the electrode pad or the solder bump analyzed by the analysis device is the same as the electrode pad or the solder bump where the probe needle is allowed to be brought into contact after analyzing the positional relationship between the shape and the electrode pad or the solder bump.

13. The position inspecting unit of claim 12,
wherein the shape is analogous to shape of the electrode pad.

* * * * *

UNITED STATES PATENT AND TRADEMARK OFFICE
CERTIFICATE OF CORRECTION

PATENT NO.       : 10,006,941 B2
APPLICATION NO.  : 15/515241
DATED            : June 26, 2018
INVENTOR(S)      : Kenta Saiki et al.

It is certified that error appears in the above-identified patent and that said Letters Patent is hereby corrected as shown below:

On the Title Page

Item (*) Notice: "Subject to any disclaimer, the term of this patent is extended or adjusted under 35 U.S.C. 154(b) by 0 days. days." should be -- Subject to any disclaimer, the term of this patent is extended or adjusted under 35 U.S.C. 154(b) by 0 days. --.

In the Specification

Column 11, Line 33, "(=θ0 θ1)" should be -- (=θ0 – θ1) --.

Signed and Sealed this
Twenty-fifth Day of September, 2018

Andrei Iancu
*Director of the United States Patent and Trademark Office*